US010204761B2

(12) United States Patent
Sunaoshi et al.

(10) Patent No.: US 10,204,761 B2
(45) Date of Patent: Feb. 12, 2019

(54) CHARGED PARTICLE BEAM DEVICE, ELECTRON MICROSCOPE AND SAMPLE OBSERVATION METHOD

(71) Applicant: Hitachi High-Technologies Corporation, Minato-ku, Tokyo (JP)

(72) Inventors: Takeshi Sunaoshi, Tokyo (JP); Yasuhira Nagakubo, Tokyo (JP); Kazutaka Nimura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/514,539

(22) PCT Filed: Oct. 9, 2014

(86) PCT No.: PCT/JP2014/077034
§ 371 (c)(1),
(2) Date: Mar. 27, 2017

(87) PCT Pub. No.: WO2016/056096
PCT Pub. Date: Apr. 14, 2016

(65) Prior Publication Data
US 2017/0221676 A1 Aug. 3, 2017

(51) Int. Cl.
*H01J 37/00* (2006.01)
*H01J 37/28* (2006.01)
(Continued)

(52) U.S. Cl.
CPC .............. *H01J 37/28* (2013.01); *H01J 37/18* (2013.01); *H01J 37/20* (2013.01);
(Continued)

(58) Field of Classification Search
CPC ............. H01J 37/28; H01J 37/18; H01J 37/20
(Continued)

(56) References Cited

U.S. PATENT DOCUMENTS

2014/0103208 A1* 4/2014 Noda ............... H01J 37/16
250/311
2014/0138542 A1 5/2014 Inada et al.
(Continued)

FOREIGN PATENT DOCUMENTS

JP 10-104141 A 4/1998
JP 2001-256911 A 9/2001
(Continued)

OTHER PUBLICATIONS

Japanese-language Office Action issued in counterpart Japanese Application No. 2016-552760 dated Sep. 19, 2017 with English translation (Ten (10) pages).
(Continued)

*Primary Examiner* — Nicole Ippolito
*Assistant Examiner* — Hanway Chang
(74) *Attorney, Agent, or Firm* — Crowell & Moring LLP

(57) ABSTRACT

Provided is an electron microscope with which a sample can be observed stably and with high accuracy. The electron microscope comprises: a sample stage; an electron optical system that scans an electron beam over a sample; a vacuum system that maintains the sample stage and the electron optical system in a vacuum; a secondary electron detector that detects secondary electrons emitted from the sample; transmitted electron detectors that detect transmitted electrons that have transmitted through the sample; and a control device that obtains a secondary electron image and a transmitted electron image on the basis of the secondary electrons and the transmitted electrons detected by the secondary electron detector and the transmitted electron detectors and stores the secondary electron image and the transmitted electron image. The sample stage is provided with cooling means for cooling the sample. The vacuum system is provided with a cold trap that sucks moisture from around the
(Continued)

sample and a vacuum gauge that measures the degree of vacuum of the vacuum system.

16 Claims, 13 Drawing Sheets

(51) Int. Cl.
*H01J 37/20* (2006.01)
*H01J 37/18* (2006.01)

(52) U.S. Cl.
CPC .......... *H01J 2237/1825* (2013.01); *H01J 2237/2001* (2013.01); *H01J 2237/2004* (2013.01); *H01J 2237/2802* (2013.01)

(58) Field of Classification Search
USPC ............................ 250/306, 307, 310, 311
See application file for complete search history.

(56) References Cited

U.S. PATENT DOCUMENTS

2014/0361165 A1* 12/2014 Sed'a ............... H01J 37/12 250/307
2015/0340199 A1 11/2015 Nagakubo et al.

FOREIGN PATENT DOCUMENTS

| JP | 2002-83564 A | 3/2002 |
| JP | 2007-80698 A | 3/2007 |
| JP | 2013-88328 A | 5/2013 |
| JP | 2014-10965 A | 1/2014 |
| WO | WO 2013/012041 A1 | 1/2013 |

OTHER PUBLICATIONS

Toyoshima, "On the Use of Holey Grids in Electron Crystallography", Ultramicroscopy, 1989, pp. 439-443, vol. 30.
Toyoshima, "Ice Embedding", Experimental Medicine, 1990, pp. 49 (433-)- 57(441), vol. 8, No. 5.
International Search Report (PCT/ISA/210) issued in PCT Application No. PCT/JP2014/077034 dated Nov. 11, 2014 with English translation (4 pages).
Japanese-language Written Opinion (PCT/ISA/237) issued in PCT Application No. PCT/JP2014/077034 dated Nov. 11, 2014 (3 pages).
Kimura, "Scanning Electron Microscope (4)", Journal of Japanese Cooking Science, 2000, vol. 33, No. 1, pp. 86-93.

* cited by examiner

[Fig. 1]
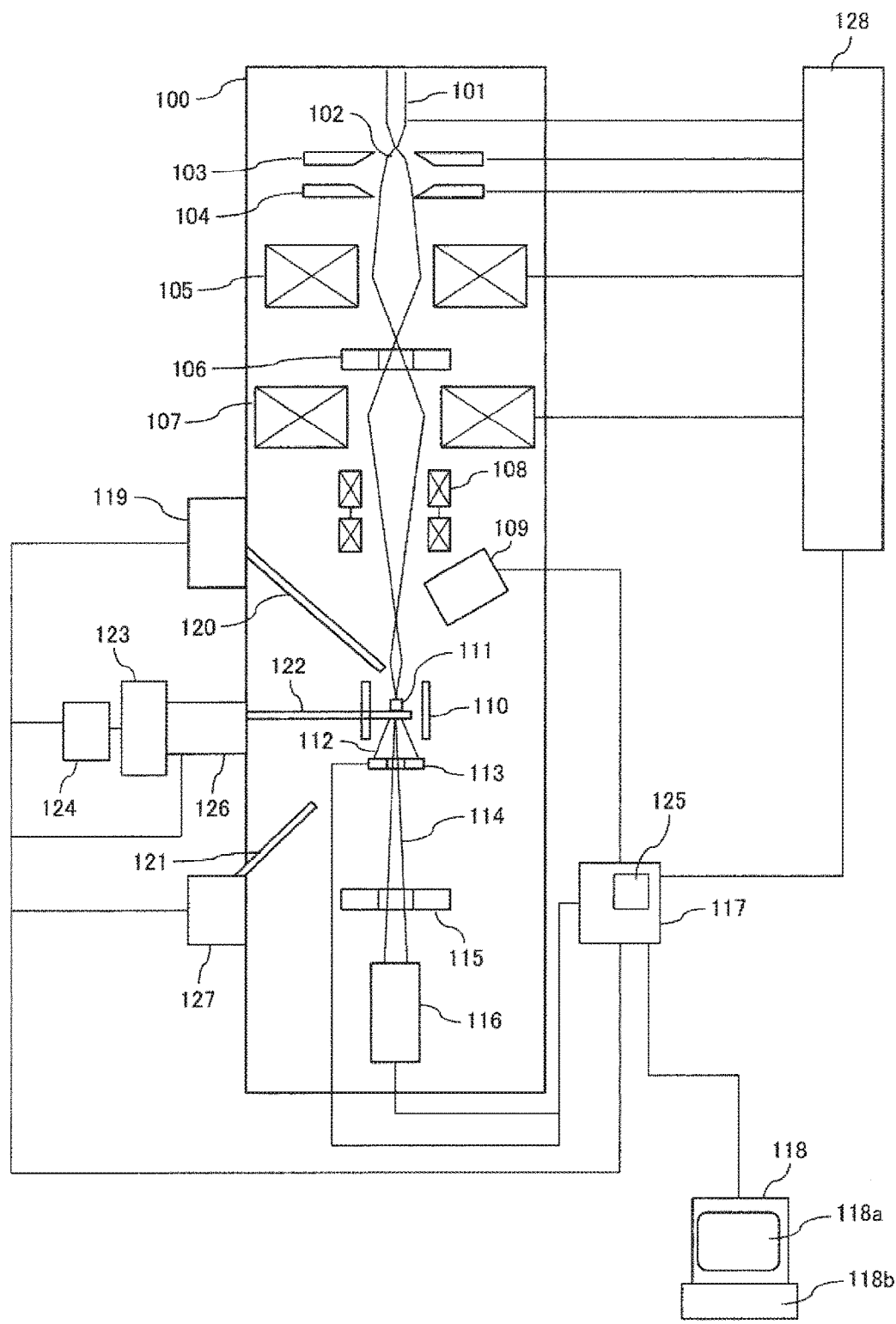

[Fig. 2A]
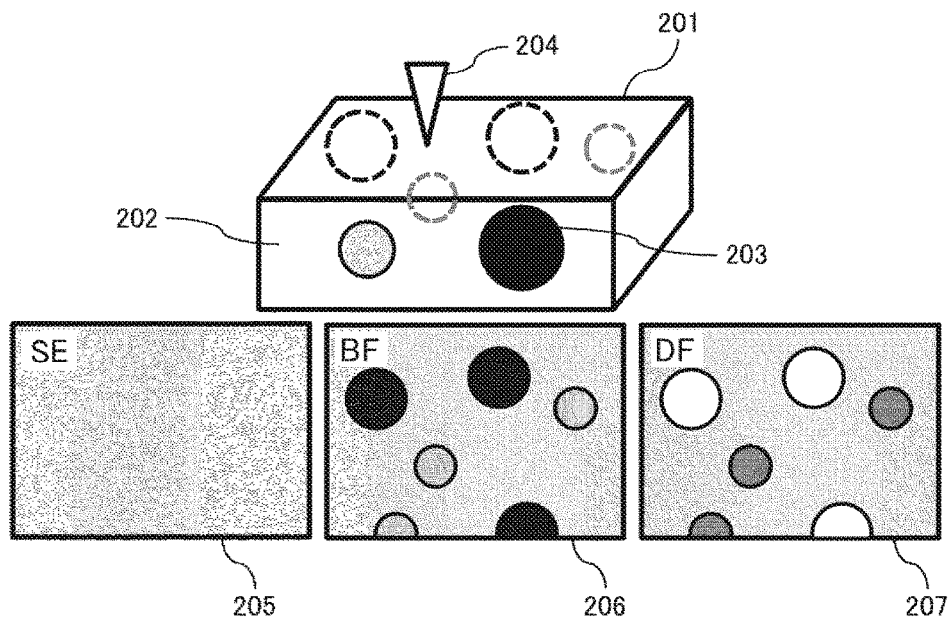
[Fig. 2B]
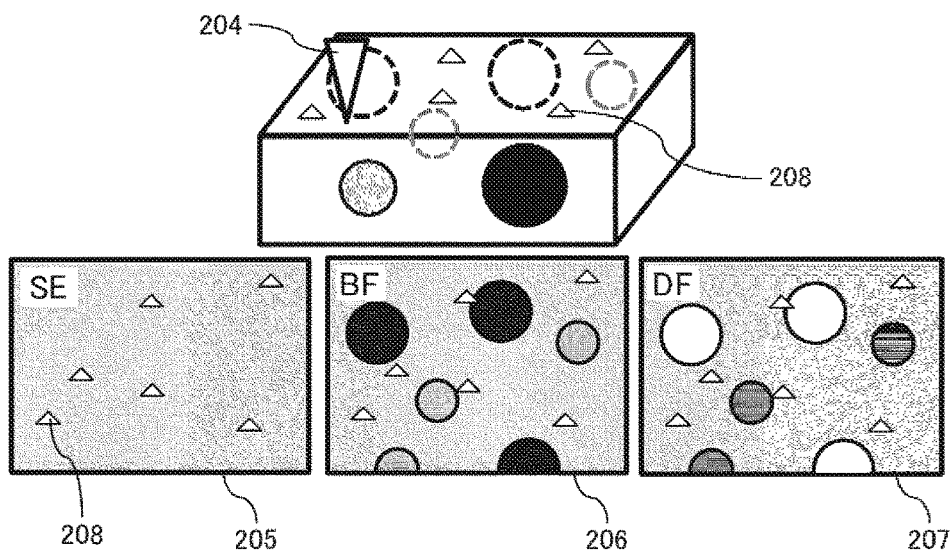

[Fig. 2C]
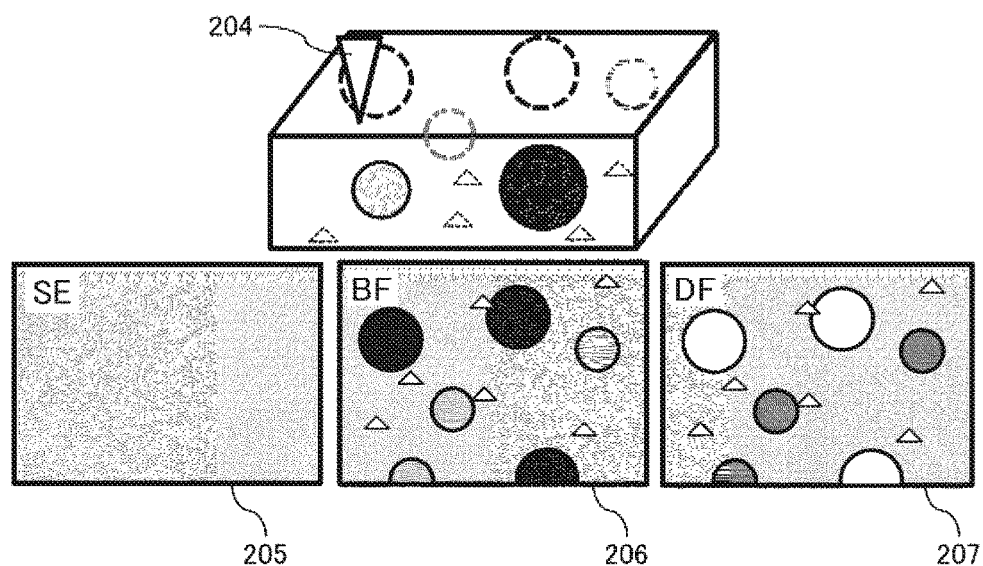
[Fig. 2D]
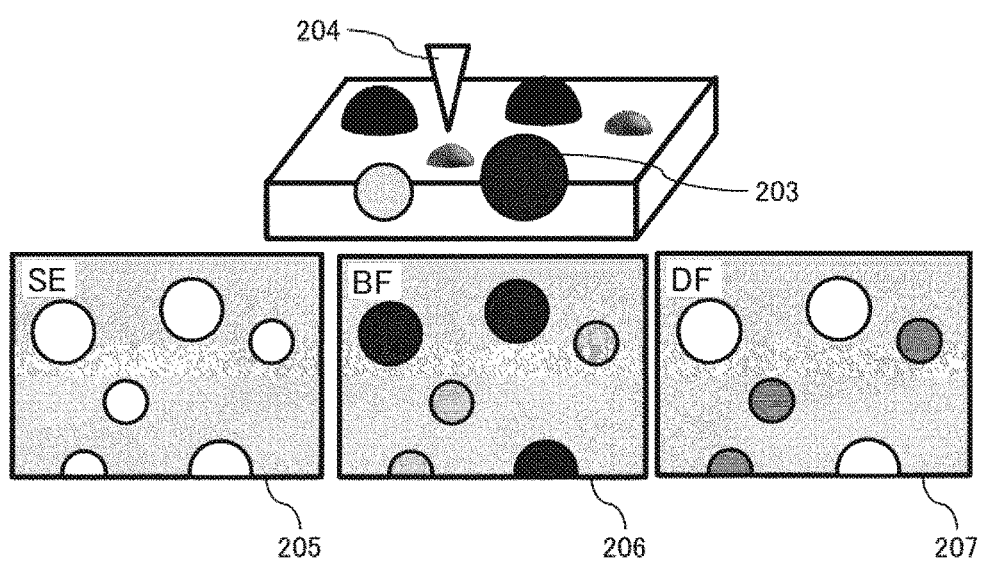

[Fig. 2E]
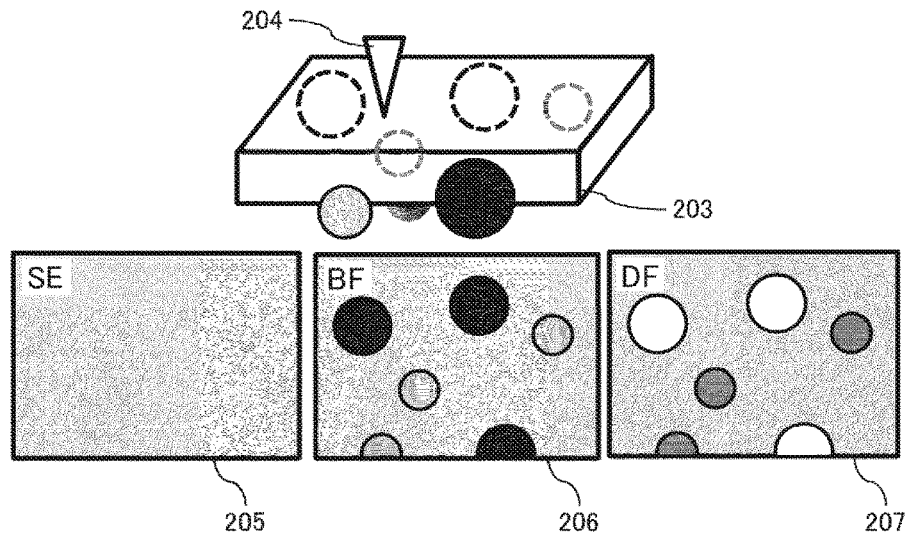
[Fig. 3]
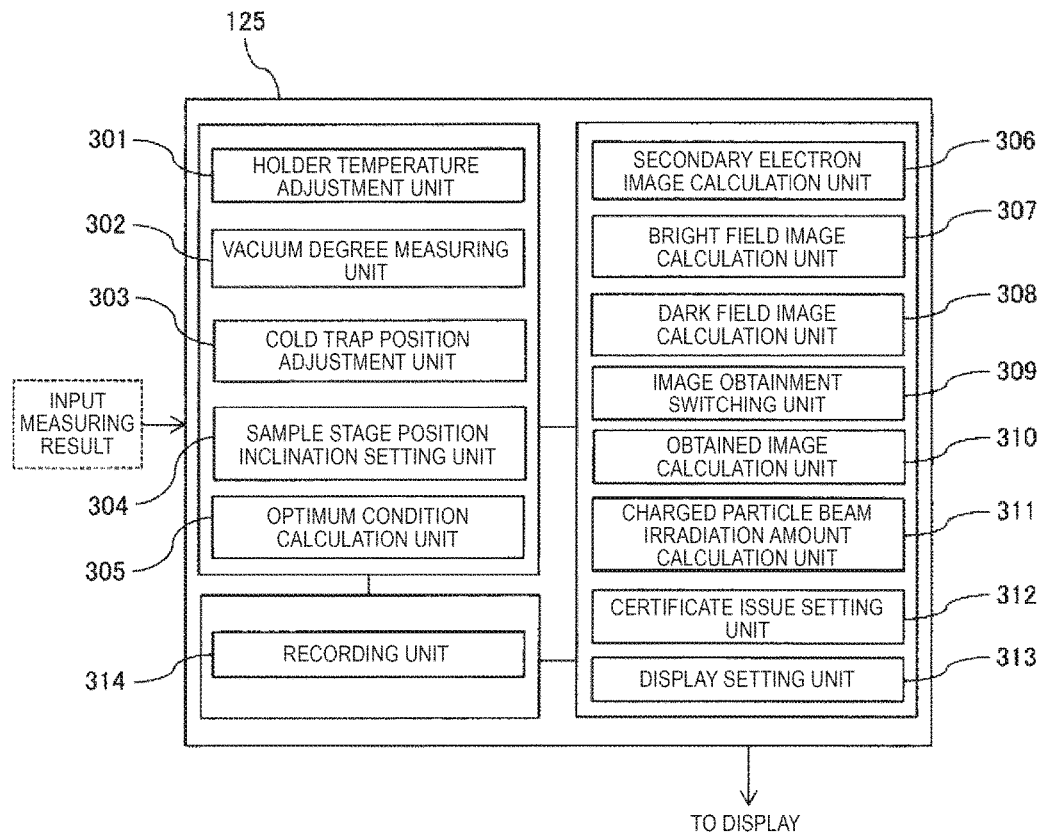

[Fig. 4]
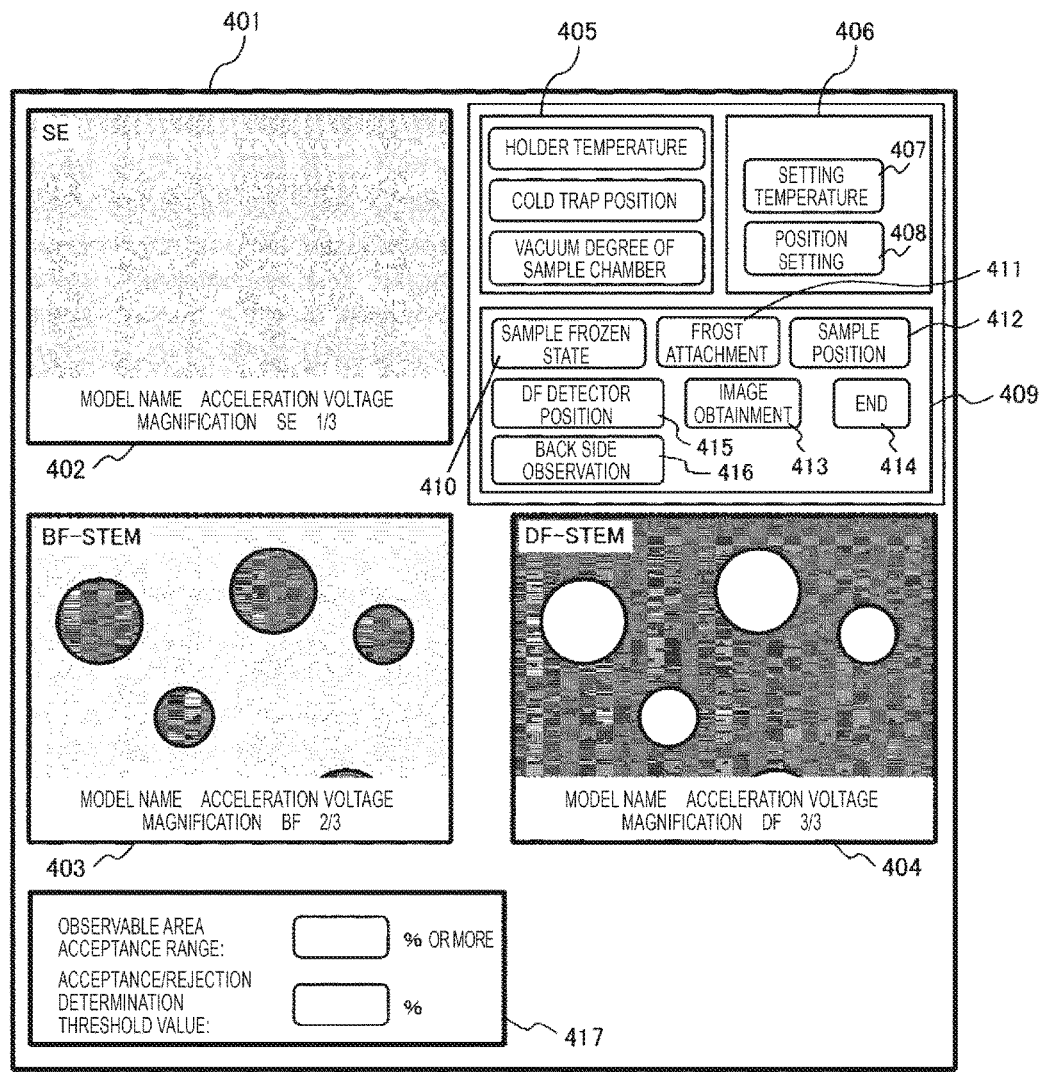

[Fig. 5A]
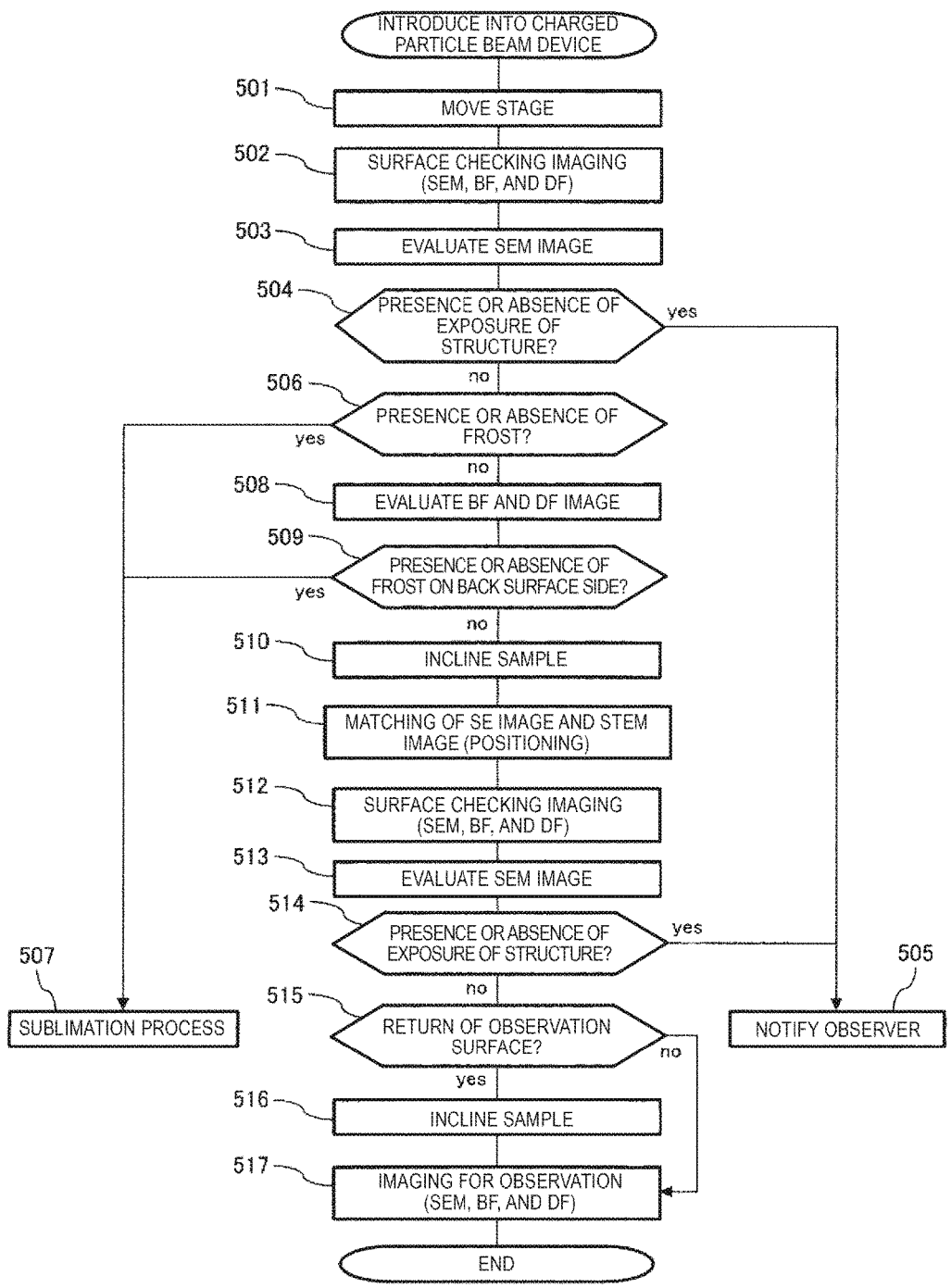

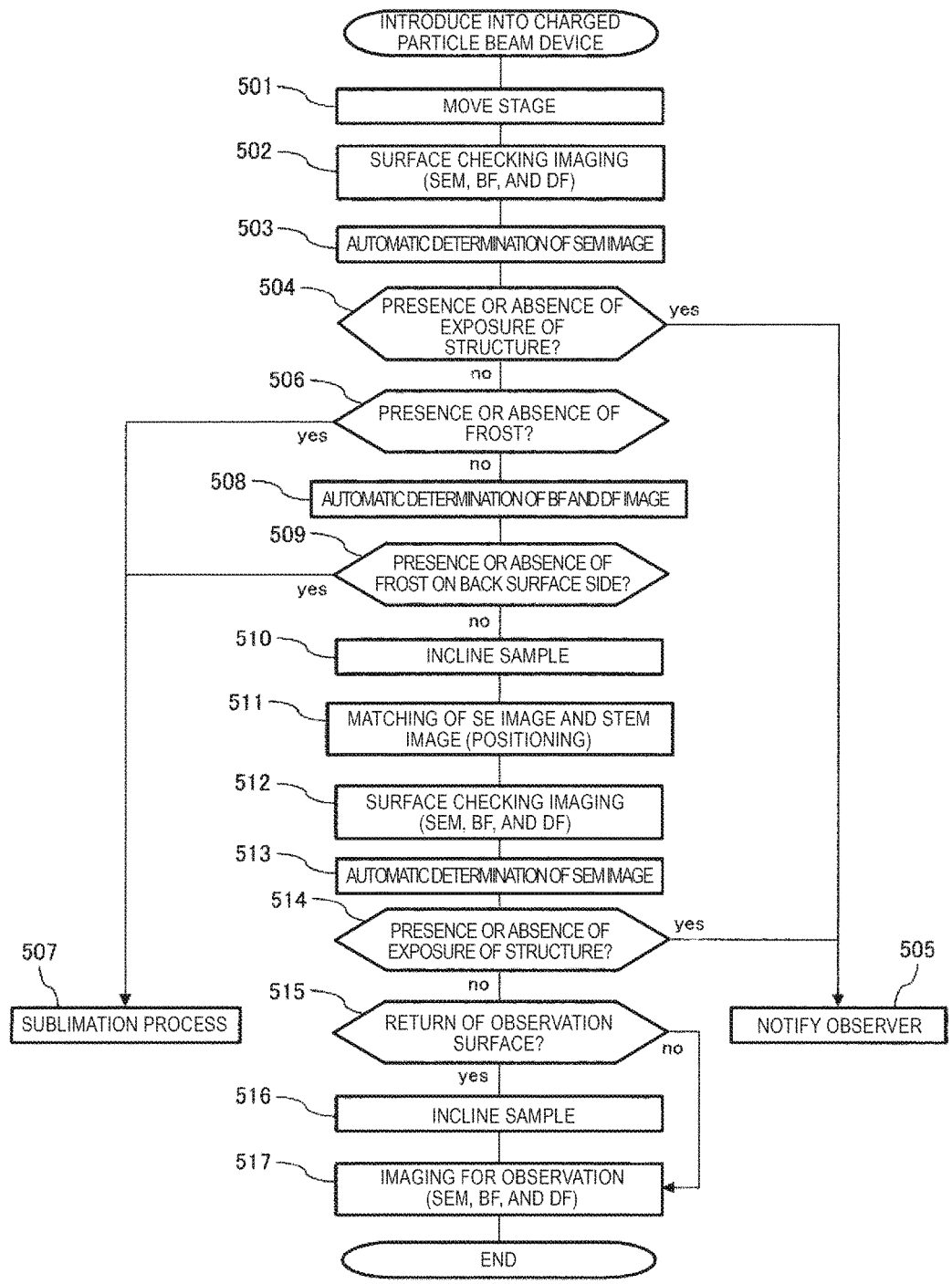
[Fig. 5B]

[Fig. 6]
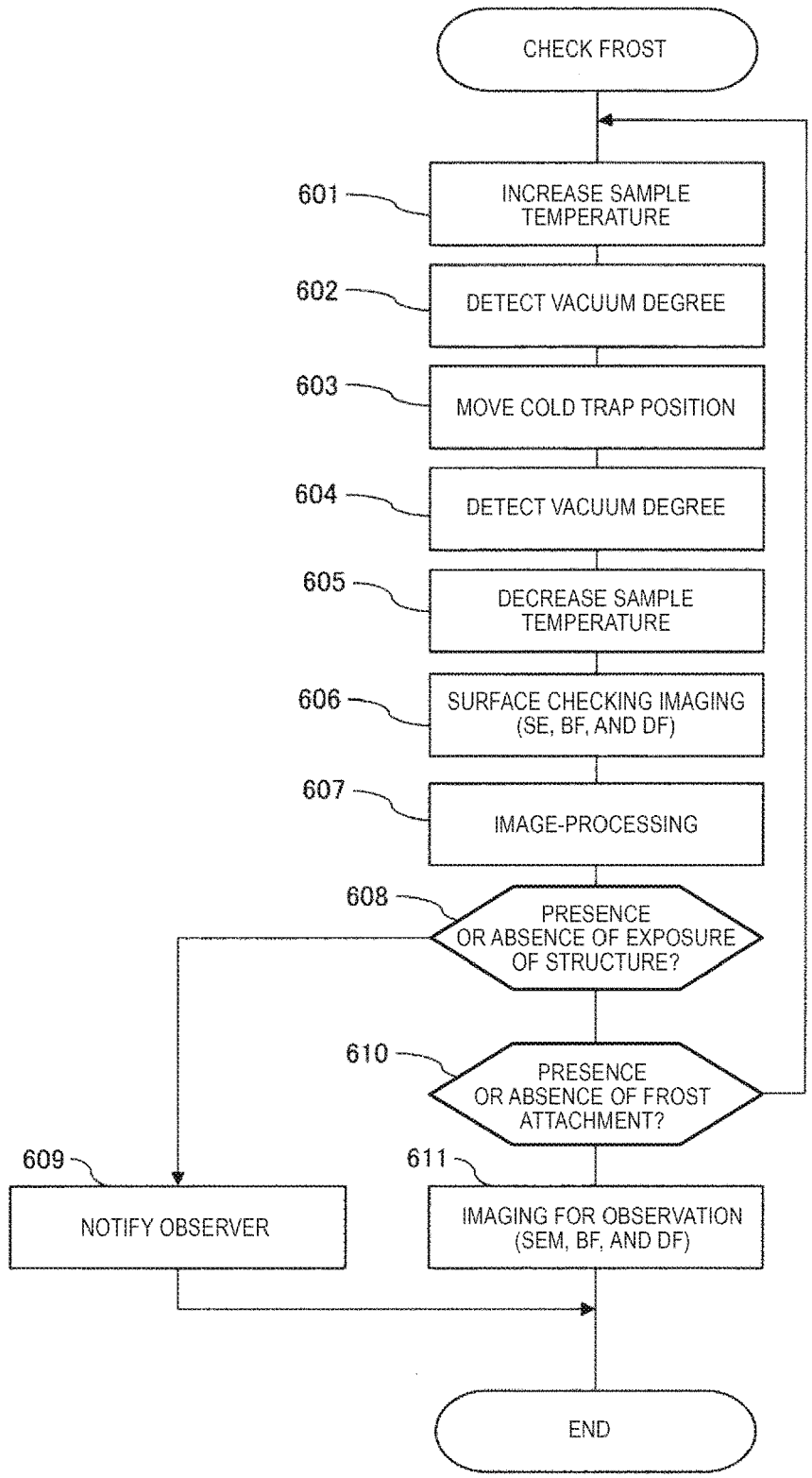

[Fig. 7A]
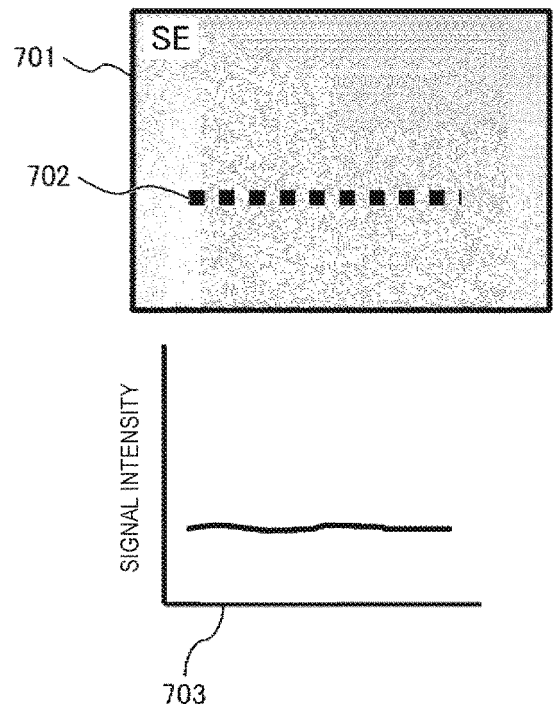
[Fig. 7B]
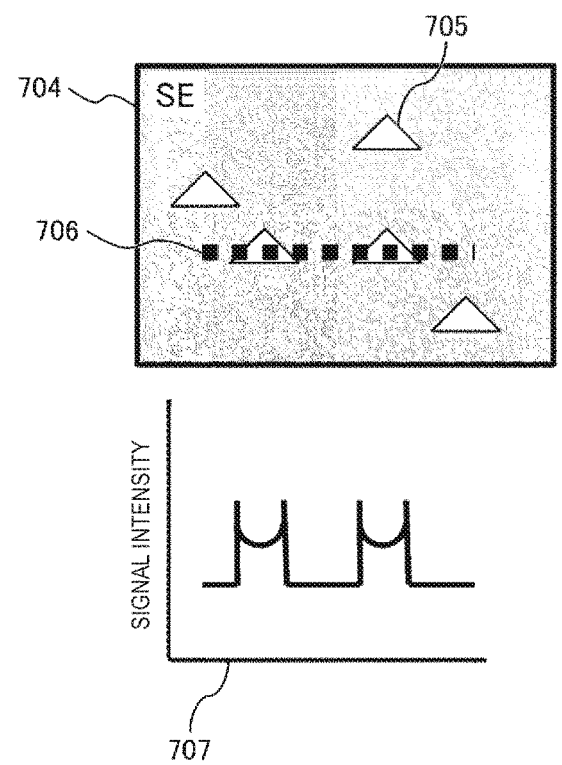

[Fig. 8A]
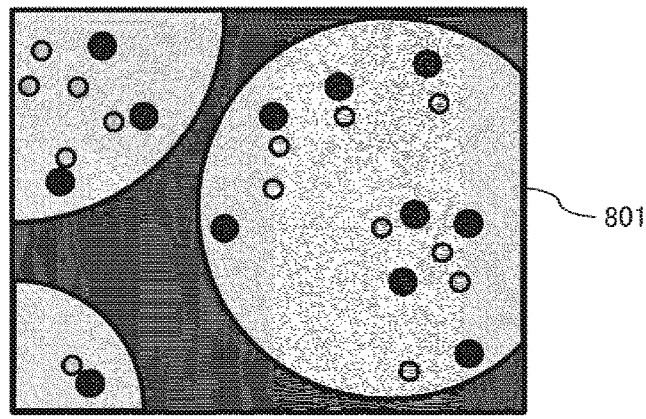
[Fig. 8B]
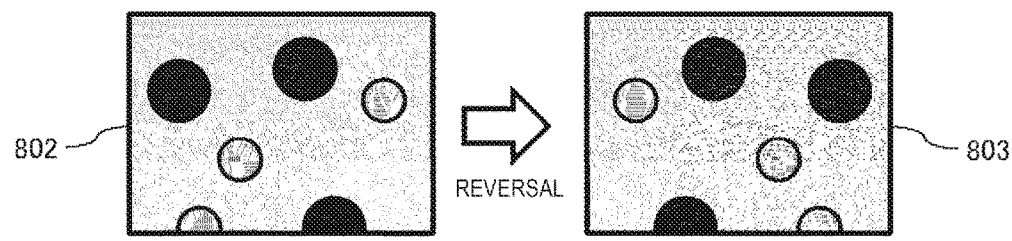
[Fig. 8C]
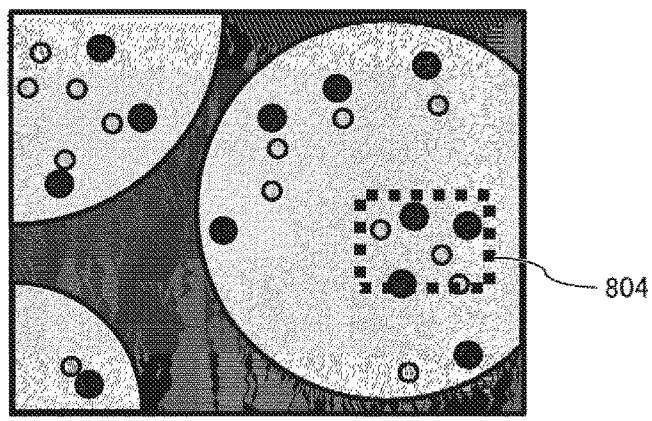

[Fig. 8D]
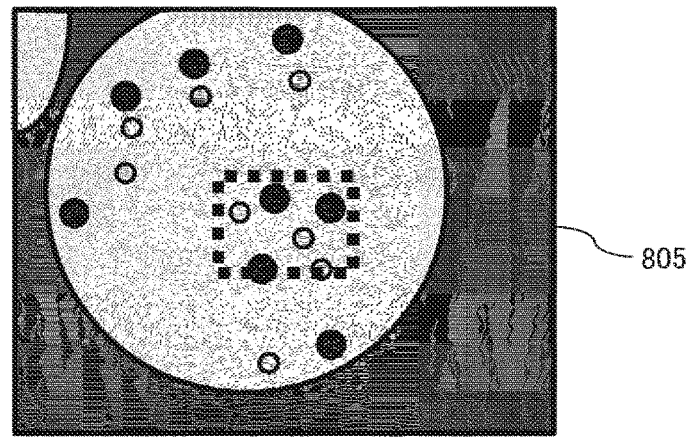
[Fig. 9A]
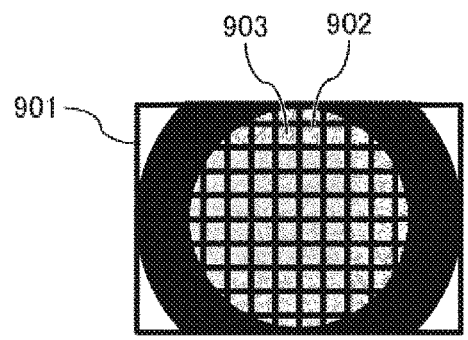
[Fig. 9B]
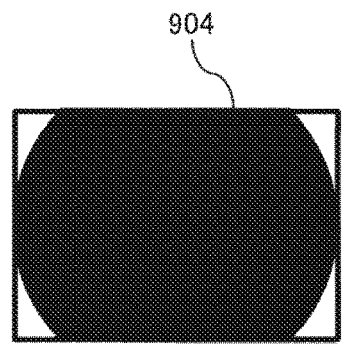

[Fig. 9C]
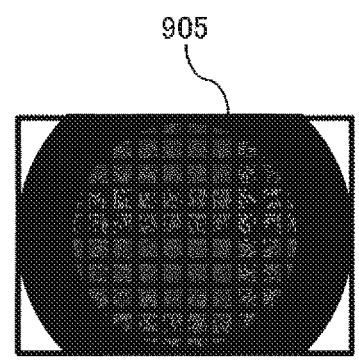
[Fig. 9D]
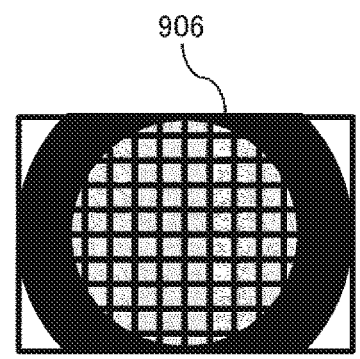

[Fig. 10A]
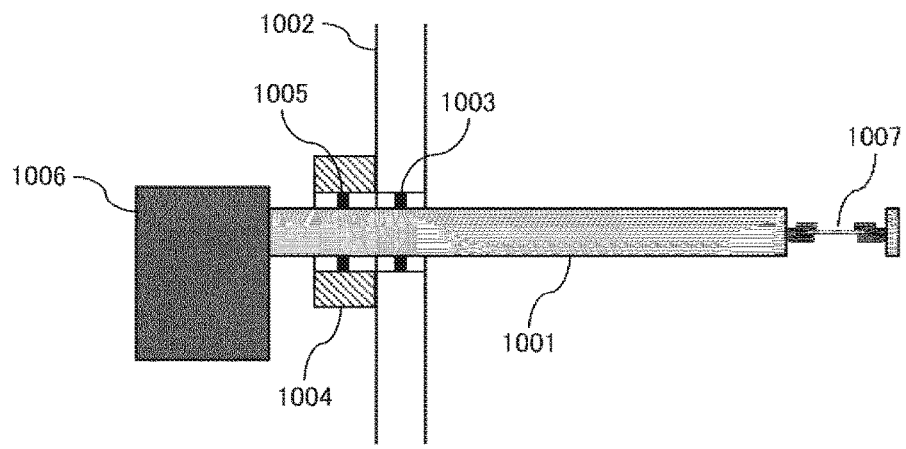
[Fig. 10B]
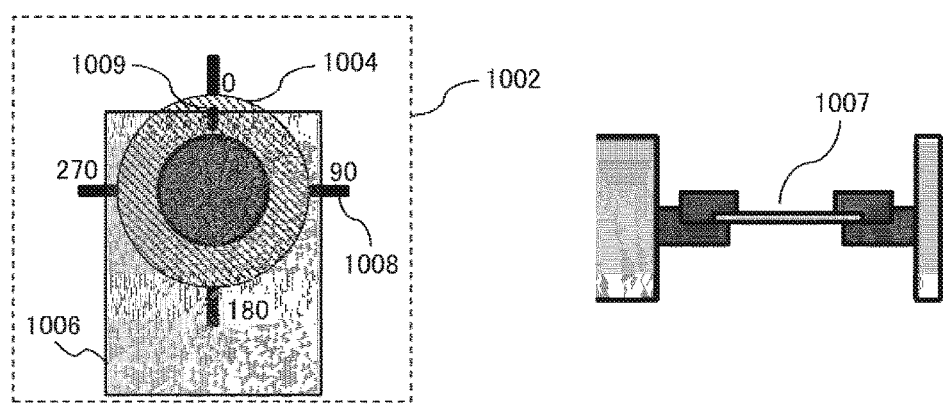
[Fig. 10C]
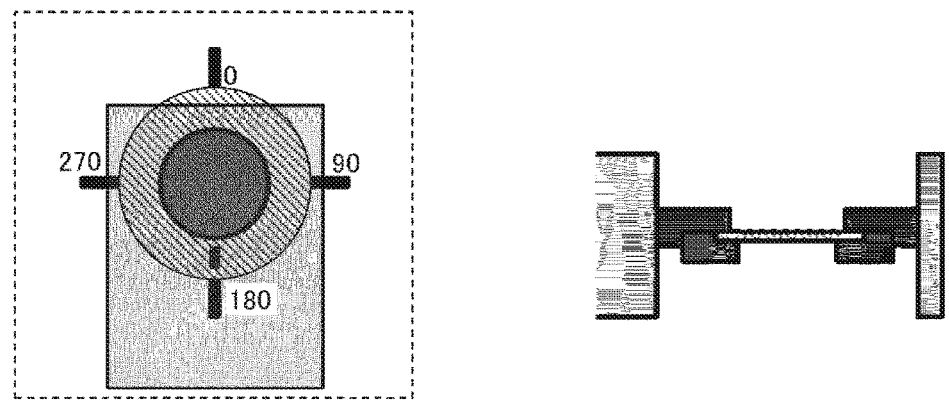

CHARGED PARTICLE BEAM DEVICE, ELECTRON MICROSCOPE AND SAMPLE OBSERVATION METHOD

TECHNICAL FIELD

The present invention relates to a charged particle beam device, an electron microscope, and a sample observation method preferable for maintaining a favorable frozen state of an observation sample.

BACKGROUND ART

In recent years, an electron microscope such as a Scanning-Electron-Microscopy (hereinafter, referred to as SEM), a Transmission-Electron-Microscopy (hereinafter, referred to as TEM), a Scanning-Transmission-Electron-Microscopy (hereinafter, also referred to as STEM), or the like has been used for observation and analysis of samples with a fine tissue structure.

Currently, for observation of biological samples using the electron microscope, samples fixed by pre-process are used. For fixation of the sample, there are a chemical fixing method using a reducing agent such as glutaraldehyde as a fixing solution and a physical fixing method of stopping movement instantaneously by rapid freezing and retaining a structure at that time.

In the chemical fixing method, since tissue is dyed with heavy metal, it is possible to observe a structure with clear contrast, but protein contained in the sample may be destroyed, and it is impossible to capture the original structure of the biological tissue. Although the physical fixing method requires a special freezing device, artifacts are not formed by a staining agent or the like, and the original structure of the biological tissue can be retained.

An ice embedding method is a method of rapidly freezing a sample and observing the sample with the electron microscope at an extremely low temperature without fixing or dyeing with a chemical reagent. Thin film samples such as organisms, foods, polymers, or the like containing water in their tissues are introduced into liquefied ethane cooled with liquid nitrogen, are rapidly frozen at a cooling rate of $10^{4\circ}$ C./sec or more, and are observed while being embedded in amorphous ice.

PTL 1 discloses a technique of rapidly freezing and observing TEM in order to accurately observe the original tissue structure of a liquid sample such as food. In addition, NPL 1 describes TEM observation of a sample using the ice embedding method. TEM or STEM described in PTL 1 and NPL 1 uses high-acceleration voltage with acceleration voltage of 80 kV to 300 kV. On the other hand, recently, an STEM detector has been attached to the SEM with acceleration voltage of 30 kV as maximum acceleration voltage, and it has been also possible to observe a transmission image at 30 kV.

CITATION LIST

Patent Literature

PTL 1: JP-A-2013-88328
PTL 2: JP-A-2014-10965

Non-Patent Literature

NPL 1: Toshima Kin, Ice-Embedding method, experimental medicine, Vol. 8, No. 5, 49 (433)-57 (441), 1990

NPL 2: Kimura Toshiaki, scanning electron microscope (4), Journal of Japanese Cooking Science, Vol. 33, No. 1, 86-93, (2000)

SUMMARY OF INVENTION

Technical Problem

In recent years, higher accuracy has been increasingly required for observation of frozen samples. In order to obtain accurate sample information by electron microscopic observation, it is necessary to evaluate whether or not a sample embedded in ice by the pre-process is appropriate for observation. In a case where the pre-process is not performed appropriately, a structure in the sample is exposed and damaged by an electron beam, and frost is generated on a surface of the ice, so that these may affect acquired images.

However, in the methods described in the above-mentioned PTL 1 and NPL 1, no consideration is given to evaluation of the sample itself after the pre-process. For this reason, according to the related technique, the evaluation is performed in a state in which frost attachment and presence or absence of exposure of the structure cannot be clearly determined.

An object of the present invention is to provide a charged particle beam device, an electron microscope, and a sample observation method which can stably observe a sample with high accuracy.

Solution to Problem

As one aspect for solving the above problem, the present invention provides a charged particle beam device including: a sample stage for supporting a sample that becomes an observation target; an optical system that irradiates the sample with a charged particle beam and scans the charged particle beam on the sample; a vacuum system that maintains the sample stage and the optical system in a vacuum; a secondary electron detector that detects a secondary electron emitted from the sample by irradiation with the charged particle beam; a transmitted electron detector that detects a transmitted electron through the sample by the irradiation with the charged particle beam; and a control device that obtains a secondary electron image and a transmitted electron image based on the secondary electron and the transmitted electron detected by the secondary electron detector and the transmitted electron detector and stores the secondary electron image and the transmitted electron image, in which the sample stage includes cooling means for cooling the sample, the vacuum system includes a cold trap that sucks moisture in a vicinity of the sample, and a vacuum gauge that measures a degree of vacuum of the vacuum system.

In addition, the present invention provides an electron microscope including: a sample stage for supporting a sample that becomes an observation target; an electron optical system that irradiates the sample with an electron beam and scans the electron beam on the sample; a vacuum system that maintains the sample stage and the electron optical system in a vacuum; a secondary electron detector that detects a secondary electron emitted from the sample by irradiation with the electron beam; a transmitted electron detector that detects a transmitted electron through the sample by the irradiation with the electron beam; and a control device that obtains a secondary electron image and a transmitted electron image based on the secondary electron and the transmitted electron detected by the secondary electron detector and the transmitted electron detector and stores the secondary electron image and the transmitted electron image, in which the sample stage includes cooling means for cooling the sample, the vacuum system includes a cold trap that sucks moisture in a vicinity of the sample, and a vacuum gauge that measures a degree of vacuum of the vacuum system.

In addition, the present invention provides a sample observation method including: obtaining a secondary electron image and a transmitted electron image of a cooled sample; observing the sample based on the obtained secondary electron image and the transmitted electron image; and observing changes of a surface state and an internal state of the sample based on the obtained secondary electron image and the transmitted electron image.

Advantageous Effects of Invention

According to one aspect of the present invention, it can be determined whether or not a sample after a pre-process is appropriate for observation with an electron microscope, and it is possible to perform high accuracy and stable observation of the electron microscope.

In addition, according to one aspect of the present invention, it is possible to observe the electron microscope while maintaining a favorable frozen state by adjusting an observation condition according to the state of the sample.

Problems, configurations, and effects other than those described above will be clarified from the description of embodiments below.

BRIEF DESCRIPTION OF DRAWINGS

FIG. 1 is a diagram illustrating a basic configuration of a charged particle beam device according to an embodiment of the present invention.

FIG. 2A is a schematic view of a sample produced by an ice embedding method.

FIG. 2B is a schematic view of the sample produced by the ice embedding method.

FIG. 2C is a schematic view of the sample produced by the ice embedding method.

FIG. 2D is a schematic view of the sample produced by the ice embedding method.

FIG. 2E is a schematic view of the sample produced by the ice embedding method.

FIG. 3 is a diagram illustrating an image process control unit according to an embodiment of the present invention.

FIG. 4 is a diagram illustrating a display according to an embodiment of the present invention.

FIG. 5A is a flowchart illustrating a sample observation method according to an embodiment of the present invention.

FIG. 5B is a flowchart illustrating the sample observation method according to an embodiment of the present invention.

FIG. 6 is a flowchart illustrating a sample observation method according to an embodiment of the present invention.

FIG. 7A is a diagram illustrating a frost determination example according to an embodiment of the present invention.

FIG. 7B is a diagram illustrating a frost determination example according to an embodiment of the present invention.

FIG. 8A is a diagram illustrating a matching example of a secondary electron image (SEM image) and a transmitted electron image (STEM image) according to an embodiment of the present invention.

FIG. 8B is a diagram illustrating a matching example of a secondary electron image (SEM image) and a transmitted electron image (STEM image) according to the embodiment of the present invention.

FIG. 8C is a diagram illustrating a matching example of a secondary electron image (SEM image) and a transmitted electron image (STEM image) according to the embodiment of the present invention.

FIG. 8D is a diagram illustrating a matching example of a secondary electron image (SEM image) and a transmitted electron image (STEM image) according to the embodiment of the present invention.

FIG. 9A is a diagram illustrating an example of sample quality determination according to an embodiment of the present invention.

FIG. 9B is a diagram illustrating an example of sample quality determination according to the embodiment of the present invention.

FIG. 9C is a diagram illustrating an example of sample quality determination according to the embodiment of the present invention.

FIG. 9D is a diagram illustrating an example of sample quality determination according to the embodiment of the present invention.

FIG. 10A is a diagram illustrating a partial cross section of a charged particle beam device according to an embodiment of the present invention.

FIG. 10B is a diagram illustrating a partial cross section of the charged particle beam device according to the embodiment of the present invention.

FIG. 10C is a diagram illustrating a partial cross section of the charged particle beam device according to the embodiment of the present invention.

DESCRIPTION OF EMBODIMENTS

Hereinafter, the present embodiments will be described with reference to drawings.

Example 1

TEM or STEM described in the literature of the Background art uses high-acceleration voltage with acceleration voltage of 80 kV to 300 kV. On the other hand, recently, an STEM detector has been attached to the SEM with acceleration voltage of 30 kV as maximum acceleration voltage, and it has been also possible to observe a transmission image at 30 kV.

In the present example, the basic embodiments of the present invention will be described. FIG. 1 is a diagram illustrating a basic configuration of a charged particle beam device according to the present example. In FIG. 1, a configuration of the SEM having the STEM detector and capable of observing an STEM image as an example of the charged particle beam device will be described. However, the present embodiment is not limited thereto, and it can be applied to, for example, the TEM or STEM having the SEM detector and capable of observing the SEM image.

The SEM illustrated in FIG. 1 is mainly configured to have an SEM lens tube 100 and a control system for controlling the SEM lens tube 100. In the SEM lens tube 100, an electron beam 102 emitted from an electron gun 101 is accelerated by an anode 104 due to an electric field formed by an extraction electrode 103 to which voltage is applied and is focused by a first focusing lens 105, and then unnecessary areas of the electron beam 102 are removed by an objective lens diaphragm 106. The electron beam 102 passing through the objective lens diaphragm 106 is narrowed down by a second focusing lens 107 and an objective lens 110. A deflection coil 108 two-dimensionally scans the narrowed electron beam 102 on a sample 111.

In a case where the sample is sufficiently thin with respect to energy of the electron beam 102, the electron beam 102 transmits through the sample 111. Among the electron beams 102, electrons transmitted through the sample 111 are divided into a bright field signal electron 114 non-scattered or scattered inelastically in the sample 111 and a dark field signal electron 112 elastically scattered in the sample 111.

After a scattering angle of the bright field signal electron 114 is limited by a bright field diaphragm 115, only the bright field signal electron 114 transmitted through the bright field diaphragm 115 is detected by a bright field signal detector 116. On the other hand, since the dark field signal electron 112 is scattered inside the sample 111, the dark field signal electron 112 transmits through the sample 111 with a certain angle and is detected by a dark field signal detector 113 disposed below the objective lens 110.

A disposition configuration of the dark field signal detector 113 operates so that the dark field signal detector 113 has a disposition configuration in which appropriate contrast between the sample 111 and the bright field diaphragm 115 is obtained in the vertical direction. For example, when a user of the device sets a dispose position of the dark field signal detector 113 so as to obtain the appropriate contrast while checking a dark field image on a display 118a of a computer 118, a position controlling signal is transferred to a control device 117 and the dark field signal detector 113 is moved.

In addition, when the electron beam 102 scans the sample 111, electrons which exist in the sample 111 are excited and released into a vacuum by inelastic scattering of the incident electrons, and then a secondary electron is generated. A secondary electron detector 109 detects the generated secondary electron.

The SEM according to the present example mainly includes the computer 118 which the user of the device uses and the control device 117 which is connected to the computer 118, communicates with the computer 118, and controls a vacuum exhaust system, an electron optical system, or the like as a control system. The computer 118 includes the display 118a on which an operation screen (Graphical-User-Interface: GUI) of the device is displayed and input means 118b for inputting to the operation screen such as a keyboard and a mouse. The computer 118, the control device 117, and each of configuration units, or a lower-order control device (for example, a cold trap position control unit 119, a temperature control unit 124, a sample movement inclination control unit 126, a vacuum gauge control unit 127, and an electron optical system control unit 128) which controls each of the configuration units according to a command transmitted from the control device 117 are respectively connected via communication lines.

Although FIG. 1 illustrates a configuration in which the control device 117 is connected to the secondary electron detector 109, the dark field signal detector 113, the bright field signal detector 116, the cold trap position control unit 119, the sample movement inclination control unit 126, the vacuum gauge control unit 127, and the electron optical system control unit 128, the present configuration is merely an example and various modification examples such as a wiring for communication are included.

The control device 117 receives signals respectively detected by the secondary electron detector 109, the bright field signal detector 116, and the dark field detector 113, performs an image-processing of the signals by a image process control unit 125, and then transmits data after the image-processing to the computer 118 and displays on the display 118a.

In addition, in a vacuum sample chamber, a cold trap 120 and the cold trap position control unit 119 for moving a tip position of the cold trap 120 are disposed, and the tip position of the cold trap 120 is moved according to a degree of vacuum and a state of frost attached to the frozen sample.

The sample chamber includes a vacuum gauge 121 for measuring the degree of vacuum and the measured degree of vacuum is sent to the image process control unit 125 included in the control device 117 through the vacuum gauge control unit 127.

The sample cooling holder 122 includes a cooling source container 123 for storing a cryogenic cooling source such as liquid helium, liquid nitrogen, or slush nitrogen and can hold a state in which the sample 111 fixed to the tip by heat conduction is frozen. The temperature control unit 124 can hold the frozen sample 111 at a constant temperature or further cool the sample 111 by a cooling source stored in the cooling source container 123. In addition, a temperature of the sample cooling holder 122 can be set to an arbitrary temperature by a heater (not illustrated) and the frost attached to a surface of the sample 111 can be sublimated. The temperature of the sample cooling holder 122 is sent to the image process control unit 125 included in the control device 117.

A sent measurement result is displayed on the display 118a of the computer 118. The sample cooling holder 122 includes the sample movement inclination control unit 126 which controls a position and an incline angle of the sample 111. An image of the sample 111 is displayed on the display 118a of the computer 118 and the position and the incline angle of the sample 111 can be set by the user of the device with the input means 118b. According to a condition set here, a command is transmitted from a sample stage position inclination setting unit (stage position adjustment unit) 304 illustrated in FIG. 3 to the sample movement inclination control unit 126 and the sample is moved and inclined.

Example 2

FIGS. 2A to 2E illustrate observation examples of samples produced by an ice embedding method.

FIG. 2A is a schematic view of a normal ice embedded sample and a schematic view of an observation result. In a sample 201 produced by the ice embedding method, a structure 203 is contained in an amorphous ice 202 while maintaining an original structure of the structure 203. When an electron beam 204 scans the sample 201, a secondary electron image (hereinafter, referred to as SE) 205 illustrates a surface of the amorphous ice 202 and unevenness information represented as a contrast change cannot be obtained. On the other hand, the structure 203 can be checked by contrast difference in a bright field image (hereinafter, referred to as BF) 206 or a dark field image (hereinafter, referred to as DF) 207 which is a transmitted electron signal.

FIG. 2B is an observation example in a case where a sample is contained in amorphous ice but a frost 208 is attached to a surface of the sample. In observation of the bright field image 206 and the dark field image 207, since the frost 208 on the surface is shown with the contrast changed, it is difficult to determine whether the frost is attached or originally present in the sample only by observing the bright field image and the dark field image. However, presence or absence of the frost can be checked by performing a surface observation by the secondary electron image 205.

FIG. 2C is an observation example in a case where a sample is contained in amorphous ice but the frost 208 is attached to a surface on a back surface side with respect to a beam incident surface. In the observation of the bright field image 206 and the dark field image 207, although the frost 208 is shown with the contrast changed, the secondary electron image 205 illustrates a surface of the amorphous ice and the unevenness information represented as a contrast change cannot be obtained. In this case, it is difficult to determine whether the frost is attached or originally present in the sample. Therefore, by inclining the sample and observing a secondary electron image, the bright field image, and the dark field image on the back surface of the sample, it can be determined the presence or absence of the frost.

FIG. 2D is an observation example in a case where an ice embedded sample is mistakenly produced, thermal damage is applied to the ice embedded sample, sublimation or melting of the amorphous ice occurs, and a structure to be included is exposed on a surface. In this case, the unevenness information is detected by the exposed structure in the secondary electron image 205 and is represented by the contrast difference. In addition, in the observation of the bright field image 206 and the dark field image 207, the structure 203 can be checked by the contrast difference. However, in such a sample, an electron beam is directly incident on the exposed structure and electron beam damage occurs, which is not preferable for observation.

FIG. 2E is an observation example in a case where an observation surface is the observation of the sample contained in amorphous ice but the structure 203 is exposed on a surface on a back surface side with respect to a beam incident surface. In this case, in the observation of the bright field image 206 and the dark field image 207, although the structure 203 is shown with the contrast changed, a secondary electron image 205 illustrates a surface of the amorphous ice and the unevenness information represented as a contrast change cannot be obtained. In this case, it is difficult to determine whether or not the sample is contained in the ice. Therefore, by inclining the sample and observing the secondary electron image, the bright field image, and the dark field image on the back side of the sample, it can be determined whether or not the sample is contained in the amorphous ice.

Example 3

FIG. 3 is a diagram for explaining functions and processes of the image process control unit 125 of FIG. 1. The image process control unit 125 determines whether or not the frozen sample 111 is in an appropriate frozen state and controls a vacuum atmosphere in order to observe stably.

The frozen sample 111 such as an ice embedded sample is fixed to the sample cooling holder 122 and introduced into the SEM lens tube 100 at a temperature which can maintain a frozen state, for example, from −90° C. to −170° C. After the sample cooling holder 122 is introduced, a temperature and a degree of vacuum of the sample cooling holder 122, and a current position of the tip of the cold trap 120 are measured, and a result thereof is input to the image process control unit 125.

For example, measured results of the temperature and the degree of vacuum of the cooled sample holder 122 and the position of the cold trap 120 are respectively input to a holder temperature adjustment unit 301, a degree of vacuum measuring unit 302, and a cold trap position adjustment unit 303 and an optimum condition is calculated by an optimum condition calculation unit 305 based on the measured results. The optimum condition calculation unit 305 obtains the condition of the setting temperature and the degree of vacuum of the cooled sample holder 122 and the position of the cold trap 120 for maintaining an appropriate degree of vacuum and sample temperature.

For example, when the sample temperature is −100° C. along a saturated vapor pressure curve of water illustrated in FIG. 1 of NPL 2, the degree of vacuum is set to $1 \times 10^{-5}$ Torr. A calculation result obtained by the optimum condition calculation unit 305 is input to the holder temperature adjustment unit 301, the degree of vacuum measuring unit 302, and the cold trap position adjustment unit 303 again.

A new setting temperature is transmitted from the holder temperature adjustment unit 301 to which the calculation result is input to the temperature control unit 124 of the holder, and a sample cooling holder temperature is reset to an appropriate temperature. In the same manner, a new setting position is transmitted from the cold trap position adjustment unit 303 to which the calculation result is input to the cold trap position control unit 119, and the tip of the cold trap 120 is reset at an appropriate position.

The sample stage position inclination setting unit (stage position adjustment unit) 304 measures a stage position so that a position of the cold trap 120 does not interfere with the sample 111. In a case of interfering, a warning is displayed on the display 118a via a display setting unit 313. In addition, in a case where a back side observation of the sample 111 is required, execution of the back side observation is selected by the display 118a, a stage on which the sample 111 is mounted is inclined and a back side becomes the observation surface. The sample holder 122 may be directly rotated in order to incline the sample.

In addition, the image process control unit 125 also determines as a reference for performing various processes by observing images formed from at least three detection signals.

For example, a signal obtained by the secondary electron detector 109 is input to a secondary electron image calculation unit 306 and a signal obtained by the bright field signal detector 116 is input to a bright field image calculation unit 307. In the same manner, a signal obtained by the dark field signal detector 113 is input to a dark field image calculation unit 308. These images can be switched by an image obtainment switching unit 309 to select and detect only one type of signal, or to simultaneously obtain a plurality of signals such as a secondary electron signal, a bright field signal, and a dark field signal.

The image process control unit 125 includes an obtained image calculation unit 310 performing an image-processing for determining whether or not the frozen sample is normally frozen from each of the obtained images. The obtained image calculation unit 310 performs comparison with the image-processing from the secondary electron image or a transmitted electron image simultaneously obtained. For example, an edge detection process is performed on the both images to extract the unevenness information, an amount by which extracted positions coincide between the both images is calculated, and whether or not the sample is exposed from the amorphous ice is determined according to magnitude of the amount. In addition, it is possible to evaluate the similarity between the both images using template matching techniques such as a normalized correlation method and a phase-only correlation method and to apply the evaluation to a suitability determination of the sample.

A charged particle beam irradiation amount calculation unit 311 measures the amount of electron beam irradiation while observing the same field of view without changing an observation magnification after performing a stage movement. For example, while observing the same field of view, it is possible to calculate observable time by storing the amount of electron beam irradiation when a state of the sample becomes inappropriate due to sublimation or melting of the amorphous ice at a certain time. The observable time is displayed on the display 118*a* via the display setting unit 313.

In a case where two or more types of signals are simultaneously obtained by the image obtainment switching unit 309, simultaneous obtainment is displayed on the image or on the display, or is recorded in a recording unit 314 or is issued as data such as a certificate or the like so as to recognize the simultaneous obtainment. Here, the certificate indicating that different types of signals are simultaneously obtained is issued by a certificate issue setting unit 312 via output means (not illustrated). This certificate is simultaneously stored when the obtained image is stored in the recording unit 314.

The obtained secondary electron signal or transmitted electron signal is simultaneously displayed on the display 118*a* by the display setting unit 313. A degree of vacuum, a sample cooling holder temperature, a cold trap temperature, and a result of determination whether or not the sample is normal other than the obtained signals can be displayed on the display 118*a* by the display setting unit 313.

The simultaneous obtainment image or the certificate, the cold trap and the stage position at image obtainment, and the measured degree of vacuum and sample cooling holder temperature are recorded in the recording unit 314.

Example 4

FIG. 4 is a diagram illustrating an example of a display when acquiring three types of signals. A screen 401 of the display 118*a* has an area in which a secondary electron image 402, a bright field image 403, and a dark field image 404 are simultaneously displayed.

In a condition display unit 405, a cooling temperature of the sample cooling holder 122, the tip position of the cold trap 120 of FIG. 1, and a value of the degree of vacuum detected by the vacuum gauge 121 are displayed. In a setting unit 406, a value which is an arbitrary temperature at which the sample cooling holder temperature is set is displayed on a setting temperature button 407. In a case where a position of the cold trap is also set to an arbitrary position, the position is displayed on an input value position setting button 408.

A sample frozen state determination instructing unit 410 for determining a state of the frozen sample and a frost attachment determination instructing unit 411 for determining the frost attachment are displayed on an operation instructing unit 409. When selecting the sample frozen state determination instructing unit 410, a flowchart illustrated in FIG. 5A or FIG. 5B can be executed. In a case where the state of the frozen sample is not appropriate after execution of the flowchart of FIG. 5A or FIG. 5B, the display is changed to a warning display.

When selecting the frost attachment determination instructing unit 411, a flowchart illustrated in FIG. 6 is executed. In a case where it is determined that the frost is attached, the frost attachment button is changed to the warning display until the frost attachment improves.

In a case where the frost attachment button 411 is selected and as a result of the determination that a position of a tip of the cold trap approaches the sample, and a result that the sample interferes with the tip of the cold trap is obtained, a sample position button 412 is changed to the warning display.

When selecting an image obtainment instructing unit 413, it is possible to simultaneously obtain the three types of the signals or to arbitrarily obtain only one type or four types of images. An instruction of the signal selected by the image obtainment instructing unit 413 is transmitted to the image obtainment switching unit 309 and the transmitted instruction is executed. In a case where four types of signals are obtained, screen areas of the condition display unit 405 or the setting unit 406 and the operation instructing unit 409 are changed to the image display, and then it is possible to simultaneously display four types of signals.

If selecting a back side observation button 416 when checking the back side is necessary, the sample is inclined.

An ice embedded sample acceptance/rejection determination setting screen 417 sets a threshold value when determining quality of an entire sample or sets an extraction area size when determining exposure of the structure.

An end button 414 is selected to end a series of cryo-observations.

Example 5

FIG. 5A and FIG. 5B illustrate a flowchart of a quality determination procedure after introducing the frozen sample into an electron microscope. FIG. 5A illustrates an example in which an observer visually checks each of images displayed on the display 118*a* and determines evaluation of the secondary electron image (SE), the bright field image (BF), and the dark field image (DF). On the other hand, FIG. 5B is a modification example of FIG. 5A and illustrates an example in which the evaluation of the secondary electron image (SE), the bright field image (BF), and the dark field image (DF) is automatically determined by the image-processing.

That is, the observer visually performs the determination in step 503, step 508, and step 513 of FIG. 5A and the determination is automatically performed by the image-processing in step 503, step 508, and step 513 of FIG. 5B corresponding to FIG. 5A.

Since the other steps of FIGS. 5A and 5B are the same, the flowcharts of FIGS. 5A and 5B will be collectively described below.

The frozen sample is fixed by the sample cooling holder at a temperature which can maintain a frozen state, for example, from −90° C. to −170° C. and is introduced into the electron microscope. After then, the stage movement is performed in order to move the field of view to an arbitrary sample position (step 501).

Next, the secondary electron image, the bright field image, and the dark field image are simultaneously obtained by the charged particle beam device and method described in Example 1 (step 502). The obtained three types of signals are sent to the image process control unit 125 of FIG. 1 and are displayed on the display 118*a*.

Here, in the example of FIG. 5A, the observer visually checks (evaluates) the secondary electron image (SEM image) displayed on the display 118*a* (step 503), determines presence or absence of exposure of the structure (step 504), and determines the presence or absence of the frost on a sample surface (step 506).

On the other hand, in the example of FIG. 5B, the determination of the secondary electron image (SEM image) is automatically performed by the image-processing (step 503), determines the presence or absence of the exposure of the structure (step 504), and determines the presence or absence of the frost on the sample surface (step 506).

In a case where the observer determines that there is the exposure of the structure or in a case where it is automatically determined that there is the exposure of the structure by the image-processing, the observer is notified that the sample is not appropriate for observation (step 505).

In a case where it is determined that there is no exposure of the structure and there is frost on the sample surface, a sublimation process in Example 6 described below is performed (step 507).

In a case where it is determined (decided) that there is no exposure of the structure and no frost on the sample surface by the observer visually checking (evaluating) the secondary electron image (SEM image) or by automatically determining from the image-processing of the secondary electron image (SEM image), each of the images of the bright field image (BF image) and the dark field image (DF image) is checked (evaluated) (step 508 of FIG. 5A) or automatic determination is performed by the image-processing of the bright field image (BF image) and the dark field image (DF image) (step 508 of FIG. 5B).

In a case where it is determined (decided) that the frost is not attached, the sample is inclined for the back side observation (step 510).

At this time, there is a case where the observation field of view greatly deviates from the observation field of view before the sample is inclined due to a sample inclination. In this case, the stage is moved from the bright field image (BF image) and the dark field image (DF image) obtained in step 502, and stage coordinates to a field of view observed before being inclined by the image-processing. That is, matching (positioning) of the secondary electron image (SEM image) and the transmitted electron image (STEM image) is performed (step 511).

Next, the secondary electron image (SEM image), the bright field image (BF image), and the dark field image (DF image) are simultaneously obtained (step 512).

Here, in the example of FIG. 5A, the observer visually checks (evaluates) the secondary electron image (SEM image) displayed on the display 118a (step 513) and determines the presence or absence of exposure of the structure (step 514).

On the other hand, in the example of FIG. 5B, the determination of the secondary electron image (SEM image) is automatically performed by the image-processing (step 513) and determines the presence or absence of the exposure of the structure (step 514).

In a case where the observer determines that there is the exposure of the structure or in a case where it is automatically determined that there is the exposure of the structure by the image-processing, the observer is notified that the sample is not appropriate for observation (step 505).

In a case where the observer determines that there is no exposure of the structure or in a case where it is automatically determined that there is no exposure of the structure by the image-processing, the sample inclination is returned, that is, return of the observation surface is selected (step 515).

In a case where it is determined that the observation surface is to be returned, the sample inclination is returned (step 516). In addition, in a case where it is determined that the observation surface is not to be returned, the sample inclination is maintained in that state.

After then, the secondary electron image (SEM image), the bright field image (BF image), and the dark field image (DF image) are respectively imaged for observation (step 517).

In a case where the observer continues imaging after the imaging is ended, the stage movement (step 501) may be performed again and the observation may be continued in another field of view. In a case where the imaging is not continued, the process is ended as it is and the sample cooling holder 122 is removed.

Example 6

FIG. 6 is a flowchart illustrating a procedure of the sublimation process of the frost 208 attached to the surface of the sample.

In a case where the frost is attached to the surface of the sample, a temperature of the sample cooling holder 122 is increased until a temperature at which the frost is sublimated at the measured degree of vacuum according to the vapor pressure curve of water (step 601).

An example of the vapor pressure curve of water is described in NPL 2 or the like, and in this example, the curve may be stored in the control device 117 and it is possible to configure so that the setting temperature can be automatically obtained. Alternatively, the user of the device can input the setting temperature based on the curve.

For example, when the degree of vacuum of the sample chamber is $1\times10^{-5}$ Torr and the sample cooling holder 122 is cooled to $-170°$ C., the frost attached to the sample surface can be sublimated by increasing the sample cooling holder temperature to approximately $-90°$ C. As a result, since the degree of vacuum inside the sample chamber is decreased, this value is detected (step 602).

Next, the tip position of the cold trap 120 is moved (step 603). The cold trap 120 sucks and traps water vapor remaining in the atmosphere inside the sample chamber and water vapor generated from the sample by sublimation to the cooled metal. It is possible to efficiently suck sublimated moisture from the sample by making the tip position closer to the sample.

After then, if the degree of vacuum is detected again (step 604) and the degree of vacuum is returned to a degree of vacuum before the sample temperature is increased (step 601), the temperature of the sample cooling holder 122 is decreased so that the sample temperature becomes appropriate for observation (step 605).

The secondary electron image (SEM image), the bright field image (BF image), and the dark field image (DF image) are respectively obtained for checking the sample surface (step 606).

In a case where the presence or absence of the exposure of the structure is determined (decided) by the observer visually checking (evaluating) each of the images or by automatically determining from the image-processing of each of the images (step 607) and it is determined (decided) that there is the exposure of the structure (step 608), the observer is notified that the sample is not appropriate for observation (step 609).

In a case where it is determined (decided) that there is no exposure of the structure, the presence or absence of the frost attachment on the sample surface is determined (decided) (step 610).

In a case where it is determined (decided) that the frost is attached to the surface of the sample, the above steps 601 to 607 are repeatedly executed.

If the structure is not exposed and the frost is also removed, the secondary electron image (SEM image), the bright field image (BF image), and the dark field image (DF image) are respectively imaged for observation (step 611).

After then, in a case where the observer continues the imaging, the stage movement may be performed and the observation may be continued in another field of view. In a case where the imaging is not continued, the process is ended as it is and the sample cooling holder 122 is removed.

Example 7

An example of a method for determining the exposure of the structure from the secondary electron image (SEM image) in FIGS. 5A to 6 (steps 504, 513, and 608) will be described.

The obtained image calculation unit 310 of FIG. 3 extracts brightness information of the bright field image (BF image) and the dark field image (DF image) or either of the bright field image and the dark field image obtained in a surface check imaging (steps 502, 512, and 606) and extracts an area in which a contrast of the structure is present (difference of adjacent numerical values is large).

The area to be extracted can also be determined by the observer at an arbitrary size, and the area size is input in the ice embedded sample acceptance/rejection determination setting screen 417 of FIG. 4. For extraction of the area, the observer may arbitrarily select one or a plurality of comparison areas from the image displayed on the display 118*a*.

Since the secondary electron image, the bright field image, and the dark field image are obtained by the same electron beam scanning, a sample positional relationship between the respective images is the same. Therefore, by respectively comparing the same areas of the images, it is possible to compare the same fields of view. A contrast of the unevenness information at the same location as the extraction area of the bright field image and the dark field image inside the secondary electron image is detected from a brightness value. When the contrast is not detected, it is determined that the structure is embedded in ice, and when the contrast is detected, it is determined that the structure is exposed.

Example 8

An example of a method of determining the presence or absence of the frost attachment from the secondary electron image in FIGS. 5A to 6 (steps 506 and 610) will be described with reference to FIG. 7A and FIG. 7B. FIG. 7A illustrates a secondary electron image 701 and a secondary electron signal intensity 703 in a case where there is no frost attachment in the sample surface. On the other hand, FIG. 7B illustrates a secondary electron image 704 and a secondary electron signal intensity 707 in a case where a frost 705 is attached to the sample surface.

The brightness information of the images of the bright field image and the dark field image or either of the bright field image and the dark field image obtained by the surface check imaging (steps 502, 512, and 606) is extracted by the obtained image calculation unit 310 of FIG. 3.

For determining the presence or absence of the frost attachment, information on a structure which is not in an observation target is used. An area other than an area selected in Example 7 is automatically selected, or the observer arbitrarily selects one or a plurality of comparison areas from the image displayed on the display 118*a*. The brightness value of the secondary electron image at the same location as the selected area is extracted.

As illustrated in FIG. 7A, since a surface shape of an ice embedded sample to which the frost is not attached is flat, for example, the secondary electron signal intensity 703 of a line 702 of the secondary electron image 701 is a substantially flat profile.

On the other hand, as illustrated in FIG. 7B, since the frost 705 is formed on the surface of the ice embedded sample with the frost attachment, a contrast is obtained as an unevenness shape in the secondary electron image 704. Therefore, the secondary electron signal intensity 707 of a line 706 of the secondary electron image 704 has a peak at an edge portion of the unevenness. This peak is detected by the obtained image calculation unit 310 of FIG. 3 to determine the frost.

Example 9

Matching of a surface observation position and a back side observation position in FIG. 5A and FIG. 5B (step 511) will be described with reference to FIGS. 8A to 8D.

First, the amount of deviation of the observation position when the sample cooling holder 122 is inclined is calculated and adjusted so as to be the same observation position before and after the inclination by the sample stage position inclination setting unit (stage position adjustment unit) 304 in FIG. 3.

However, if the observation magnification is equal to or larger than 10,000 times, there is a case where the surface checking observation position is not moved to the same field of view by adjustment of the sample stage position inclination setting unit (stage position adjustment unit) 304. In this case, detailed positioning is performed using the image-processing. The sample is observed at a lower magnification than at the time of performing the surface check imaging (step 502) (801 in FIG. 8A).

Here, the bright field image obtained by the surface check imaging (step 502) or an image obtained by the obtained image calculation unit 310 of FIG. 3 reversing the dark field image (802 of FIG. 8B) in the same direction as an inclination direction is set as a search target image (803 of FIG. 8B).

By the image-processing such as a template matching method, a pattern of the search target image is detected from a low magnification image being observed (804 in FIG. 8C).

The stage is moved so that a detection position is at a center of the screen (805 of FIG. 8D) and the secondary electron image, the bright field image, and the dark field image are obtained in the same condition as the surface observation.

Example 10

There is a case where the sample may not be appropriate for observation of the electron microscope at first due to a thickness of the frozen sample 111. In this case, it is desirable to respond by re-producing the sample 111 at an earlier stage or replacing the sample with a new one or the like.

FIGS. 9A to 9D illustrate an example of discrimination on observability of the sample 111. The discrimination can be executed between step 501 and step 502 of FIGS. 5A and 5B described in Example 5. As a result of the discrimination, in a case where it is determined that observation is impossible, it is possible to respond by replacing the sample 111 or the like in step before the surface check imaging (SEM, BF, and DF) in step 502.

First, as illustrated in FIG. 9A, for checking the entire sample, the bright field image of sample mounted mesh without ice embedding is obtained in advance (901). At this time, although many electrons incident on a mesh base material 902 are absorbed inside the sample or scattered largely and transmitted through the sample at an angle, so that a signal detected by the bright field signal detector 116 of FIG. 1 is reduced and a dark image is obtained.

On the other hand, in a sample mounting unit 903 such as a supporting film, many incident electrons are non-scattered or scattered inelastically, so that the signal detected by the bright field signal detector 116 increases and a bright image is obtained. An observation condition of these images and gradation of a sample mounting position are stored.

Next, the gradation of the bright field image is set as a reference value and the gradation (threshold value) in an observable case is set. Furthermore, if a percentage is equal to or larger than the threshold value for an area of the entire observation field of view, whether to pass as observation sample is set. These two settings can be arbitrarily set by the observer from the ice embedded sample acceptance/rejection determination setting screen 417 on the display 118a of FIG. 1.

Next, the secondary electron image and the bright field image of the ice embedded sample are observed using the observation condition. When the embedded ice is thick, the bright field image becomes a dark image on the whole (904) as illustrated in FIG. 9B. On the other hand, the thinner the embedded ice is, the brighter the image is obtained (905 and 906).

By the image-processing of the bright field image, it is discriminated whether or not the sample is appropriate for observation. Here, by acquiring the image of the secondary electron, if the image is not improved after the sublimation process of the ice, factors other than the ice can be estimated.

Example 11

In the present example, an example of a sample inclination method at the back side observation will be described. By using a holder as illustrated in PTL 2, the cooled sample holder can incline the sample while maintaining a posture of a cooling source container in a fixed direction. As a result, it is possible to prevent problems such as vibrations of the sample unit caused by boiling (bubbling) of a liquid surface position of a cooling source (for example, liquid nitrogen) in the cooling source container being changed due to the sample inclination and spillage of the cooling source.

FIG. 10A illustrates a state in which a sample cooling holder 1001 is attached to a holder receiving unit 1002 of the charged particle beam device. The sample cooling holder 1001 is slidably or rotatably attached to the holder receiving unit 1002 through an O-ring 1003. In addition, a sample movement inclination control unit 1004 is fixed to the sample cooling holder 1001 by an adhesive jig 1005.

If the observer selects execution of the back side observation, the sample movement inclination control unit 1004 rotates, for example, by motor driving, the sample cooling holder 1001 in contact with the sample movement inclination control unit 1004 rotates in the same manner, and the back surface becomes the observation surface. At this time, since a cooling source container 1006 is in a state of maintaining a posture of the cooling source container 1006, the cooling source in the cooling source container does not spill.

FIGS. 10B and 10C are enlarged views of a positional relationship between the sample cooling holder 1001, the holder receiving unit 1002, and the sample movement inclination control unit 1004 and a sample mounting unit 1007 when observing the front and back surfaces.

The holder receiving unit 1002 includes a inclined angle display 1008 and the sample movement inclination control unit 1004 includes a sample surface position memory 1009 indicating the sample surface position. Accordingly, it is possible to perceive an incline angle of the current sample.

In some sample holders, only a sample observation unit can be inclined. In this case, an inclination mechanism of the sample holder may be used.

In each of the above-described examples, an example in which the bright field image and the dark field image are used as the transmitted electron image has been described, but either one of the bright field image and the dark field image may be used. It is more desirable to use both the bright field image and the dark field image so as to improve accuracy of the sample observation.

The present invention is not limited to the above-described examples, but includes various modification examples. For example, the above-described examples have been described in detail in order to explain the present invention in an easy-to-understand manner, and are not necessarily limited to those having all the configurations described. In addition, a part of the configuration of one example can be replaced with the configuration of another example, and the configuration of another example can be added to the configuration of one example. In addition, it is possible to add, delete, and replace other configurations with respect to the part of the configuration of each of the examples.

REFERENCE SIGNS LIST

100 . . . SEM lens tube
101 . . . electron gun
102, 204 . . . electron beam
103 . . . extraction electrode
104 . . . anode
105, 107 . . . focusing lens
106 . . . objective lens diaphragm
108 . . . deflection coil
109 . . . secondary electron detector
110 . . . objective lens
111, 201 . . . sample
112 . . . dark field signal electron
113 . . . dark field signal detector
114 . . . bright field signal electron
115 . . . bright field diaphragm
116 . . . bright field signal detector
117 . . . control device
118 . . . computer
118a . . . display
118b . . . input means
119 . . . cold trap position control unit
120 . . . cold trap
121 . . . vacuum gauge
122, 1001 . . . sample cooling holder
123, 1006 . . . cooling source container
124 . . . temperature control unit
125 . . . image process control unit
126, 1004 . . . sample movement inclination control unit 127 . . . vacuum gauge control unit
128 . . . electron optical system control unit
202 . . . amorphous ice
203 . . . structure
205, 402, 701, 704 . . . secondary electron image
206, 403, 801, 802, 803, 805, 901, 904, 905, 906 . . . bright field image
207, 404 . . . dark field image
208, 705 . . . frost
301 . . . holder temperature adjustment unit
302 . . . degree of vacuum measuring unit
303 . . . cold trap position adjustment unit
304 . . . sample stage position inclination setting unit (stage position adjustment unit)
305 . . . optimum condition calculation unit
306 . . . secondary electron image calculation unit
307 . . . bright field image calculation unit
308 . . . dark field image calculation unit
309 . . . image obtainment switching unit
310 . . . obtained image calculation unit
311 . . . charged particle beam irradiation amount calculation unit
312 . . . certificate issue setting unit
313 . . . display setting unit
314 . . . recording unit
401 . . . screen
405 . . . condition display unit
406 . . . setting unit
407 . . . setting temperature button
408 . . . input value position setting button
409 . . . operation instructing unit
410 . . . sample frozen state determination instructing unit
411 . . . frost attachment determination instructing unit
412 . . . sample position button
413 . . . image obtainment instructing unit
414 . . . end button
415 . . . dark field signal detector control button
416 . . . back side observation button
417 . . . ice embedded sample acceptance/rejection determination setting screen
703, 707 . . . secondary electron signal intensity
902 . . . mesh base material
903 . . . sample mounting unit
1002 . . . holder receiving unit
1003 . . . O-ring
1005 . . . adhesive jig
1007 . . . sample mounting unit
1008 . . . inclined angle display
1009 . . . sample surface position memory

The invention claimed is:

1. A charged particle beam device comprising:
a sample stage for supporting a sample that becomes an observation target;
an optical system that irradiates the sample with a charged particle beam and scans the charged particle beam on the sample;
a vacuum system that maintains the sample stage and the optical system in a vacuum;
a secondary electron detector that detects a secondary electron emitted from the sample by irradiation with the charged particle beam;
a transmitted electron detector, disposed on an opposite side of the sample from the optical system, that detects a transmitted electron transmitted through the sample by the irradiation with the charged particle beam; and
a control device that obtains a secondary electron image and a transmitted electron image based on the secondary electron and the transmitted electron detected by the secondary electron detector and the transmitted electron detector and stores the secondary electron image and the transmitted electron image,
wherein the sample stage includes cooling means for cooling the sample,
the vacuum system includes a cold trap that sucks moisture in a vicinity of the sample, and
a vacuum gauge that measures a degree of vacuum of the vacuum system;
wherein the cold trap includes a movement mechanism that moves a tip position of the cold trap based on a state of frost attached to the sample.

2. The charged particle beam device according to claim 1, wherein the sample stage further includes sample inclining means capable of changing an irradiated surface of the charged particle beam with respect to the sample.

3. The charged particle beam device according to claim 1, wherein the transmitted electron detector is a bright field signal detector that detects a non-scattered electron and an inelastic scattered electron among transmitted electrons generated by scattering of the charged particle beam in the sample.

4. The charged particle beam device according to claim 1, wherein the transmitted electron detector is a dark field signal detector that detects an inelastic scattered electron among transmitted electrons generated by scattering of the charged particle beam in the sample.

5. The charged particle beam device according to claim 1, wherein the control device includes determination means that determines a cooling state of the sample based on the obtained secondary electron image and the transmitted electron image.

6. An electron microscope comprising:
a sample stage for supporting a sample that becomes an observation target;
an electron optical system that irradiates the sample with an electron beam and scans the electron beam on the sample;
a vacuum system that maintains the sample stage and the electron optical system in a vacuum;
a secondary electron detector that detects a secondary electron emitted from the sample by irradiation with the electron beam;
a transmitted electron detector, disposed on an opposite side of the sample from the electron optical system, that detects a transmitted electron transmitted through the sample by the irradiation with the electron beam; and
a control device that obtains a secondary electron image and a transmitted electron image based on the secondary electron and the transmitted electron detected by the secondary electron detector and the transmitted electron detector and stores the secondary electron image and the transmitted electron image,
wherein the sample stage includes cooling means for cooling the sample,
the vacuum system includes a cold trap that sucks moisture in a vicinity of the sample, and
a vacuum gauge that measures a degree of vacuum of the vacuum system;
wherein the cold trap includes a movement mechanism that moves a tip position of the cold trap based on a state of frost attached to the sample.

7. The electron microscope according to claim 6, wherein the sample stage further includes sample inclining means capable of changing an irradiated surface of the electron beam with respect to the sample.

8. The electron microscope according to claim 6,
wherein the transmitted electron detector is a bright field signal detector that detects a non-scattered electron and an inelastic scattered electron among transmitted electrons generated by scattering of the electron beam in the sample.

9. The electron microscope according to claim 6,
wherein the transmitted electron detector is a dark field signal detector that detects an inelastic scattered electron among transmitted electrons generated by scattering of the electron beam in the sample.

10. The electron microscope according to claim 6,
wherein the control device includes determination means that determines a cooling state of the sample based on the obtained secondary electron image and the transmitted electron image.

11. The electron microscope according to claim 6,
wherein the cold trap includes a movement mechanism that can move a tip position of the cold trap to an arbitrary position in the vicinity of the sample.

12. A sample observation method comprising:
detecting a secondary electron emitted from a cooled sample;
detecting a transmitted electron transmitted through the cooled sample to a transmitted electron detector on an opposite side of the cooled sample;
obtaining a secondary electron image and a transmitted electron image of a cooled sample based on the secondary electron and the transmitted electron;
observing the cooled sample based on the obtained secondary electron image and the transmitted electron image;
observing changes of a surface state and an internal state of the cooled sample based on the obtained secondary electron image and the transmitted electron image;
sucking moisture from a vicinity of the cooled sample with a cold trap; and
moving a tip position of the cold trap based on a state of frost attached to the cooled sample.

13. The sample observation method according to claim 12,
wherein the transmitted electron image is a bright field image.

14. The sample observation method according to claim 13, further comprising:
determining a state of the sample based on gradation of the obtained bright field image.

15. The sample observation method according to claim 12,
wherein the transmitted electron image is a dark field image.

16. The sample observation method according to claim 12, further comprising:
determining a cooling state of the sample based on the obtained secondary electron image and the transmitted electron image;
continuing to obtain the secondary electron image and the transmitted electron image in a case where it is determined that the cooling state of the sample is favorable; and
changing an obtainment condition of the secondary electron image and the transmitted electron image in a case where it is determined that the cooling state of the sample is not favorable.

* * * * *